US009754823B2

(12) United States Patent
Brovman et al.

(10) Patent No.: US 9,754,823 B2
(45) Date of Patent: Sep. 5, 2017

(54) SUBSTRATE INCLUDING SELECTIVELY FORMED BARRIER LAYER

(71) Applicants: International Business Machines Corporation, Armonk, NY (US); SUSS MicroTec Photonic Systems Inc., Corona, CA (US)

(72) Inventors: Yuri M. Brovman, Larchmont, NY (US); Brian M. Erwin, Lagrangeville, NY (US); Nicholas A. Polomoff, White Plains, NY (US); Jennifer D. Schuler, Wappingers Falls, NY (US); Matthew E. Souter, Tustin, CA (US); Christopher L. Tessler, Poughquag, NY (US)

(73) Assignees: INTERNATIONAL BUSINESS MACHINES CORPORATION, Armonk, NY (US); SÜSS MICROTEC PHOTONIC SYSTEMS INC., Corona, CA (US)

( * ) Notice: Subject to any disclaimer, the term of this patent is extended or adjusted under 35 U.S.C. 154(b) by 0 days.

(21) Appl. No.: 14/288,840

(22) Filed: May 28, 2014

(65) Prior Publication Data
US 2015/0348831 A1 Dec. 3, 2015

(51) Int. Cl.
*H01L 21/768* (2006.01)
(52) U.S. Cl.
CPC .... *H01L 21/76841* (2013.01); *H01L 21/7684* (2013.01); *H01L 21/7685* (2013.01);
(Continued)

(58) Field of Classification Search
CPC ............. H01L 23/485; H01L 21/76831; H01L 21/76834; H01L 21/76883;
(Continued)

(56) References Cited

U.S. PATENT DOCUMENTS 4,508,749 A  4/1985 Brannon et al.
4,684,437 A  8/1987 Donelon et al.
(Continued)

FOREIGN PATENT DOCUMENTS

DE  3843230 C  9/1989

OTHER PUBLICATIONS

List of IBM Patents or Patent Applications Treated as Related; Sep. 15, 2014, 2 pages.
(Continued)

*Primary Examiner* — Latanya N Crawford
(74) *Attorney, Agent, or Firm* — Cantor Colburn LLP; Steven Meyers

(57) ABSTRACT

A method of selectively locating a barrier layer on a substrate includes forming a barrier layer on a surface of the substrate. The barrier layer comprises of a metal element and a non-metal element. The barrier layer may also be formed from a metal element and non-metal element. The method further includes forming an electrically conductive film layer on the barrier layer, and forming a metallic portion in the electrically conductive film layer. The method further includes selectively ablating portions of the barrier layer from the dielectric layer to selectively locate place the barrier layer on the substrate.

10 Claims, 24 Drawing Sheets

(52) U.S. Cl.
CPC .. *H01L 21/76825* (2013.01); *H01L 21/76837* (2013.01); *H01L 21/76865* (2013.01); *H01L 21/76877* (2013.01); *H01L 21/76883* (2013.01)

(58) Field of Classification Search
CPC ......... H01L 21/76841; H01L 21/76825; H01L 21/76837; H01L 21/76865; H01L 21/76877; H01L 21/7685; H01L 21/7684
See application file for complete search history.

(56) References Cited

U.S. PATENT DOCUMENTS

| | | | |
|---|---|---|---|
| 5,093,279 A | | 3/1992 | Andreshak et al. |
| 5,221,426 A | * | 6/1993 | Tessier .............. H01L 21/32131 216/49 |
| 5,380,678 A | * | 1/1995 | Yu ..................... H01L 21/76877 257/E21.584 |
| 6,106,627 A | | 8/2000 | Yializis |
| 6,242,341 B1 | | 6/2001 | Yoo |
| 7,271,086 B2 | | 9/2007 | Tang et al. |
| 7,332,429 B2 | | 2/2008 | Lotz |
| 7,575,999 B2 | | 8/2009 | Benson et al. |
| 8,365,401 B2 | * | 2/2013 | Tseng ..................... H05K 3/465 29/846 |
| 2005/0160575 A1 | * | 7/2005 | Gambino ............ H01L 23/5227 29/602.1 |
| 2007/0281451 A1 | * | 12/2007 | Wu ....................... H01L 29/456 438/570 |
| 2009/0053889 A1 | * | 2/2009 | Hong ................ H01L 21/76846 438/643 |
| 2012/0184099 A1 | | 7/2012 | Souter |
| 2012/0312588 A1 | * | 12/2012 | Tseng ..................... H05K 3/465 174/257 |
| 2013/0270703 A1 | * | 10/2013 | Zierath ............ H01L 21/76877 257/751 |
| 2014/0202742 A1 | * | 7/2014 | Jones ................. B23K 26/0051 174/253 |

OTHER PUBLICATIONS

Matthew E. Souter et al; "Laser Etching System Including Mask Reticle for Multi-Depth Etching;" U.S. Appl. No. 14/483,321, filed Sep. 11, 2014.
List of IBM Patents or Patent Applications Treated as Related; Aug. 21, 2015, 2 pages.
Yuri M. Brovman, et al., "Substrate Incluing Selectively Formed Barrier Layer" U.S. Appl. No. 14/828,608, filed Aug. 18, 2015.
Cuomo et al., "Dry Lithographic Method for Patterning Storage Media", IPCOM000042826D Feb. 4, 2005, (originally published in IBM TDB Jun. 1984, pp. 505-507).
Pawlak et al., "Industrial integration of interdigitated back-contact Si solar cells by laser ablation", In 37th IEEE Photovoltaic Specialists Conference (PVSC), pp. 001116-001118, 2011.
Ulieru et al., "Sensors Microprocessing by Laser Direct Patterning (LDP) for Industrial Production", In IEEE International Semiconductor Conference, vol. 2, pp. 379-382, 2006.
Zaleckas et al., "Thin-film machining by laser-induced explosion", Appl. Phys. Letters, vol. 31, No. 9, Nov. 1, 1997, pp. 615-617.

* cited by examiner

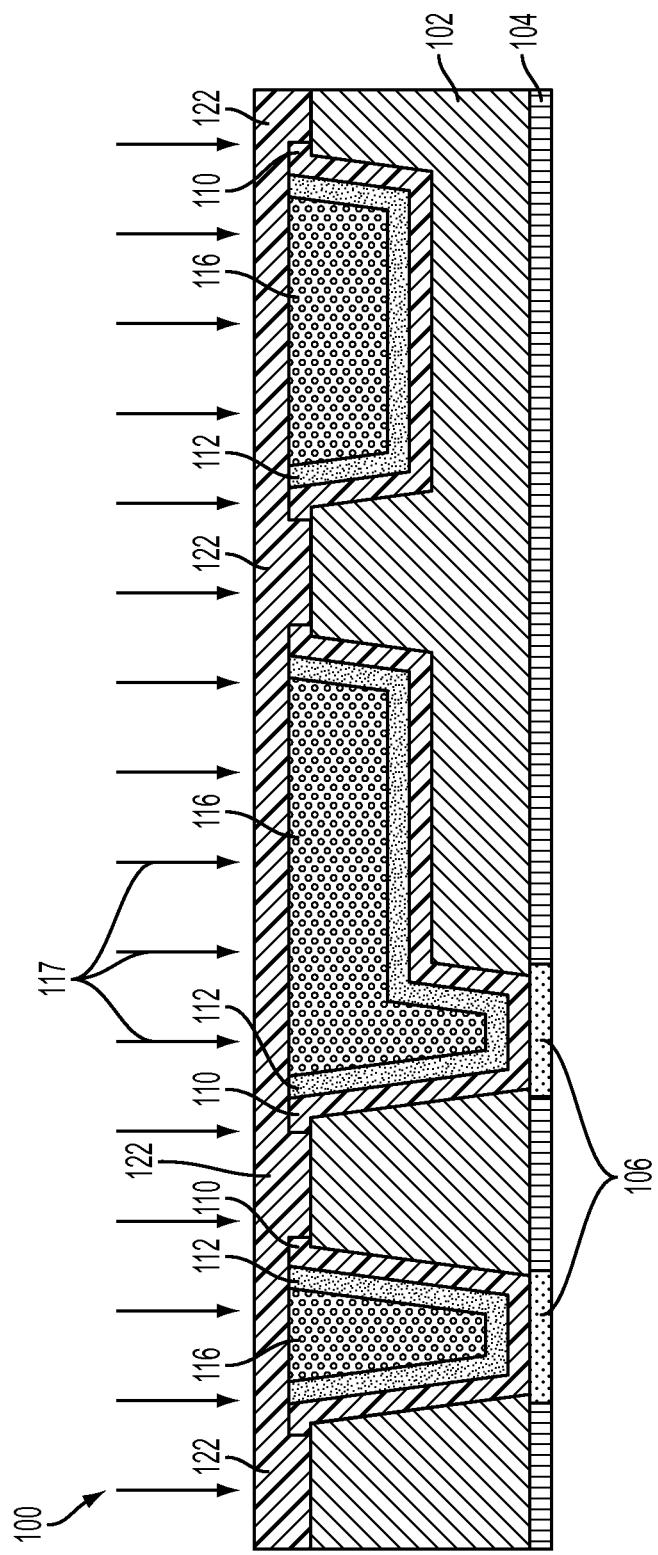

SUBSTRATE INCLUDING SELECTIVELY FORMED BARRIER LAYER

BACKGROUND

The present invention relates generally to semiconductor fabrication processes, and more specifically, to a method of selectively forming a barrier layer on a substrate.

Substrates including metallic electrical interconnects are typically formed using a wide variety of etching techniques to selectively form and locate targeted layers, such as barrier layers, on the substrate. In many cases, it is desirable to etch a targeted layer without damaging one or more layers formed beneath the targeted layer. Planarization techniques, such as a chemical-mechanical planarization (CMP) process, are typically used to remove one or more metal layers. The CMP process, however, provides poor metal selectivity and can inadvertently damage soft polymeric dielectric films that are intended to be preserved.

Chemical etching techniques are also used to remove targeted layers formed on a semiconductor substrate. However, the effectiveness of conventional chemical etching techniques is limited to the particular material of the targeted layer. Chemical etching techniques also cause undesirable undercutting in the etched layers.

Laser etching techniques, such as ablative photodecomposition (APD), are based on a concept that energy can be imparted to a substrate using a laser radiation to selectively ablate a targeted layer. Radiation absorption occurs very rapidly and produces material fragments which eject or "ablate" from the surface of the material, leaving behind a localized etched region. Selectivity can be provided using a mask to limit where laser radiation is applied to a targeted layer, or through the inclusion of features in the target layer which have different ablation thresholds. The manner in which material is removed by APD is related to the amount of laser radiation applied and properties of the features including its vaporization temperature, radiation absorption, and thermal conductivity. This process can work in such a manner in which laser radiation sufficiently heats or shocks the metal due to discontinuity of the interface, a specified feature or area such that nearby features, with lower thresholds, experience APD, possibly in a manner which ejects the initially radiated feature.

SUMMARY

A method of selectively locating a barrier layer on a substrate includes forming a barrier layer on a surface of the substrate. The barrier layer comprises of a metal element and a non-metal element. The barrier layer may also be formed from a metal element and non-metal element. The method further includes forming an electrically conductive film layer on the barrier layer, and forming a metallic portion in the electrically conductive film layer. The method further includes selectively ablating portions of the barrier layer from the dielectric layer to selectively locate place the barrier layer on the substrate.

According to another embodiment, a method of selectively locating a barrier layer on a substrate comprises forming a barrier layer on a surface of the substrate. The barrier layer is formed from a barrier material comprising a metal element and a non-metal element. The method further includes forming an electrically conductive film layer in the barrier layer. The method further includes forming a surface component on the electrically conductive film layer, and selectively ablating portions of at least one of the barrier layer and the conductive film layer from the dielectric layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. FIGS. 1-9E illustrate a method of selectively locating a barrier layer on a substrate according to an embodiment, in which:

FIG. 1 is a cross-sectional view of a starting substrate including a plurality of cavities formed in a dielectric layer;

FIG. 2 illustrates the substrate of FIG. 1 following deposition of a barrier layer that conforms to the inner surfaces of the cavities and the upper surface of the dielectric layer;

FIG. 3 illustrates the substrate of FIG. 2 following deposition of a conductive film layer on the barrier layer;

FIG. 4 illustrates the substrate of FIG. 3 following deposition of a metal material that fills the cavities and covers the conductive film layer;

FIG. 5 illustrates the substrate of FIG. 4 following a planarization process that planarizes the metal material and stops on the barrier layer to form respective wiring regions;

FIG. 6 illustrates the substrate of FIG. 5 while undergoing a laser ablation process that directs energy pulses to the substrate;

FIG. 7 illustrates the substrate of FIG. 6 showing portions of the barrier layer ablating from the dielectric layer in response to the energy pulses;

FIG. 8 illustrates the substrate of FIG. 7 having portions of the barrier layer being removed from the dielectric layer located adjacent to preserved wiring regions; and FIGS. 9A-9E illustrate the substrate of FIG. 8 following formation of an encapsulating layer that encapsulates the wiring regions according to an embodiment.

FIGS. 10-14E are a series of diagrams illustrating a process flow of selectively locating a barrier layer on a substrate according to another embodiment, in which:

FIG. 10 illustrates is a cross-sectional view of a starting substrate including a barrier layer formed on a dielectric layer, a conductive film layer formed on the barrier layer, and a surface component formed on the conductive film layer;

FIG. 12 shows portions of the barrier layer and conductive film layer located adjacent to the metal element ablating from the dielectric material in response to the energy pulses performed according to the first embodiment shown in FIGS. 11A;

FIG. 13 illustrates the substrate of FIG. 12 having portions of the barrier layer removed from the dielectric layer located adjacent to a preserved surface component; and FIGS. 14A-14E illustrate the substrate of FIG. 13 following formation of an encapsulating layer that encapsulates the surface component according to an embodiment.

DETAILED DESCRIPTION

Figure 1:
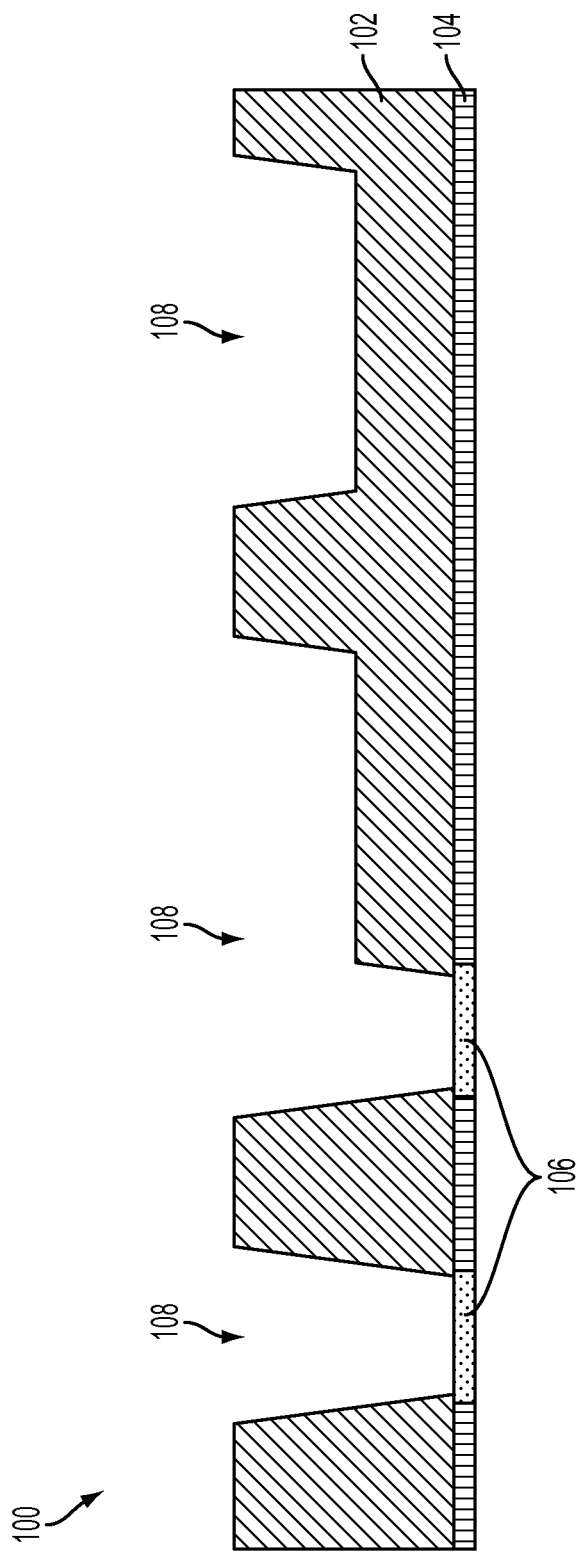

With reference now to FIG. 1, a starting substrate 100 is illustrated according to an exemplary embodiment. The starting substrate 100 includes a dielectric layer 102 formed on an underlying layer 104. The dielectric layer 102 may be photodefinable and comprised of an organic material. Various polymer materials may be used to form the dielectric layer 102 including, but not limited to, polyimide (PI), polybenzobisoxaxole (PBO), epoxy, bisbenzocyclobutene (BCB), and blends thereof. According to at least one exemplary embodiment, one or more contact pads 106 are disposed in the underlying layer 104. The contact pad 106 is formed from any suitable conducting material including, but not limited to, copper, copper alloy, aluminum, etc. The contact pad 106 is formed in or on the underlying layer 104 using one or more conventional semiconductor processing techniques, such as, for example, photolithography and reactive ion etch (RIE), chemical vapor deposition (CVD), plasma enhanced chemical vapor deposition (PECVD), and atomic layer deposition (ALD). A plurality of cavities 108 are formed in the dielectric layer 102. The cavities are formed according to one or more different patterns. At least one cavity 108 extends through dielectric layer 102 to expose a portion of a corresponding contact pad 106.

Figure 2:
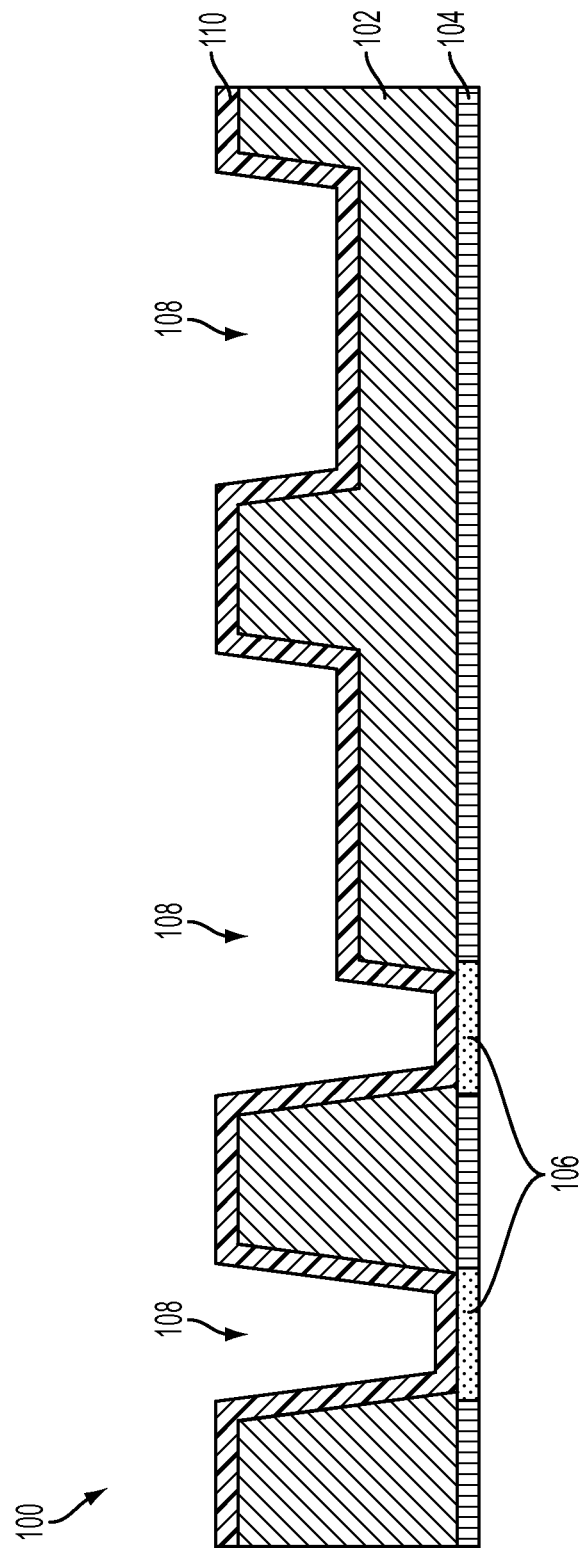

Referring to FIG. 2, a barrier layer 110 is deposited on the dielectric layer 102. The barrier layer 110 conforms to the inner surfaces of the cavities 108 and the upper surface of the dielectric layer 102. According to at least one embodiment, the barrier layer 110 is configured as an etch stop layer which is described in greater detail below. The barrier layer 110 may be formed from a barrier material comprising a metal element and a non-metal element. The barrier layer 110 may also include a plurality of barrier layers to form a multi-layer barrier layer. The barrier layer 110 has a thickness ranging, for example, from approximately 500 angstroms (Å) to approximately 5000 Å.

The barrier layer 110 may also be formed from a barrier material having an electrical conductivity that is substantially less than metal. It is appreciated that the electrical conductivity may also be ascertained based on the electrical resistivity of the material as understood by one of ordinary skill in the art. The balance between the metal element (e.g. Ta) and the non-metal element (e.g. N) determines the electrical resistivity of the resulting barrier material. In this regard, a ratio of the metal element and the non-metal element may determine the electrical resistivity of the barrier material. According to an embodiment, the ratio of the electrical resistivity between the metal element and the non-metal element is, for example, 5(metal element):1(non-metal element), which forms a barrier layer 110 having an electrical resistivity ranging, for example, from approximately 200 micro-ohm*cm to approximately 400 micro-ohm*cm. In an embodiment, for example, the metal element of the barrier layer 110 may have an electrical resistivity of approximately 200 micro-ohm*cm. The resistivity can be adjusted based on processing.

Figure 3:
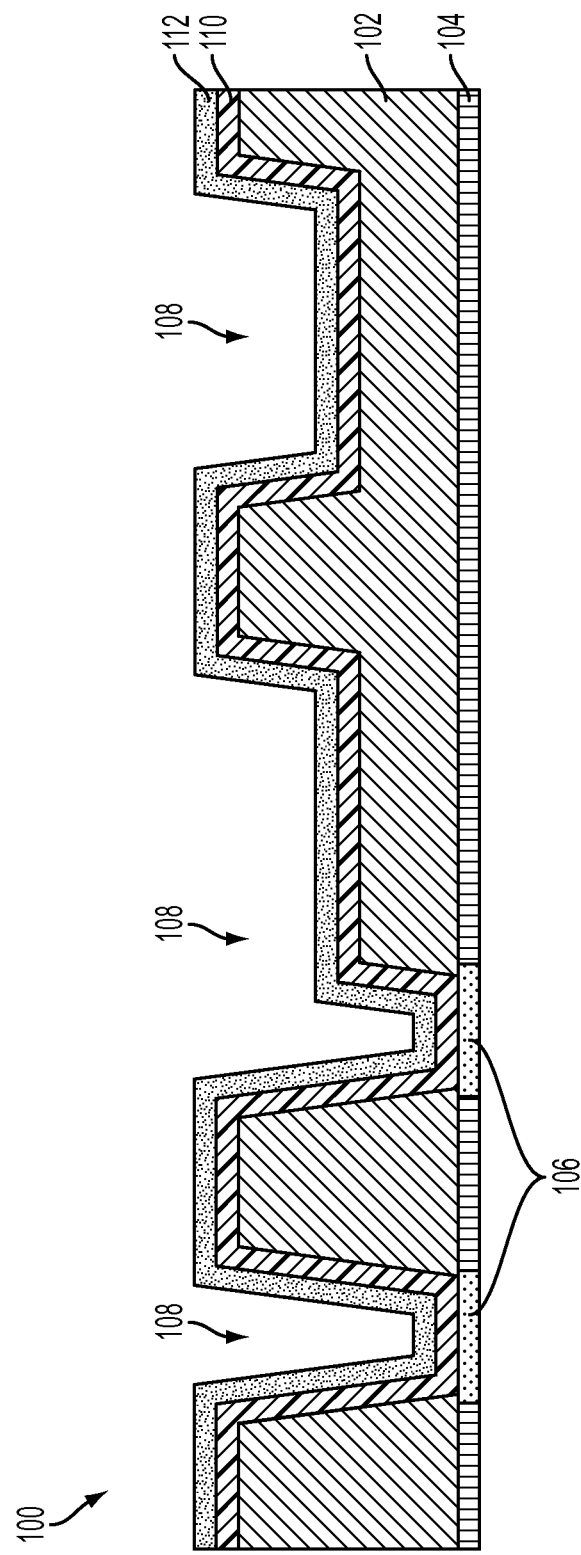

Turning to FIG. 3, an electrically conductive film layer 112 is formed on the barrier layer 110. The conductive film layer 112 conforms to the outer surface of the barrier layer 110 without completely filling the cavities 108. The conductive film layer 112 is formed from a metallic material such as, for example, copper (Cu) and serves as a seed layer for subsequent electroplating processes.

Figure 4:
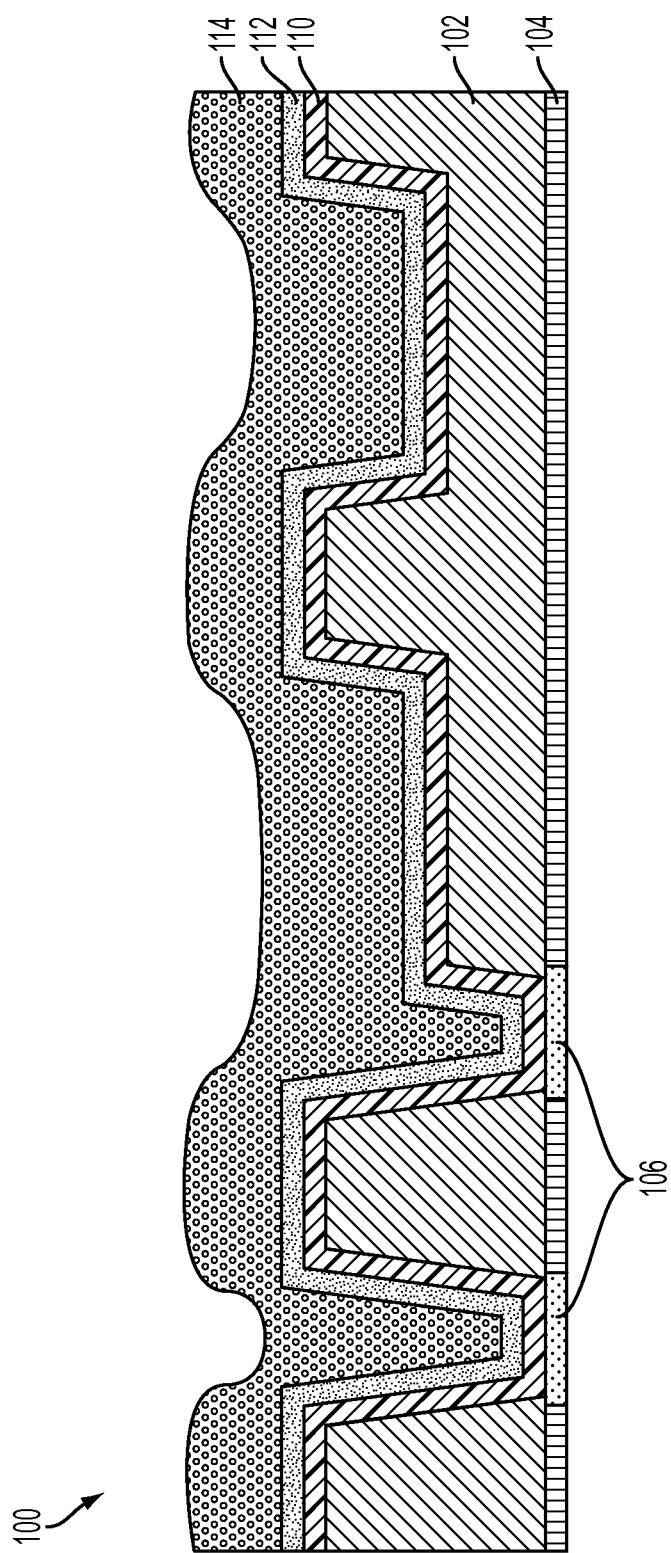

Referring to FIG. 4, an electrically conductive metal material 114 is deposited on the conductive film layer 112. The metal material 114 fills the cavities 108 and covers an upper surface of the conductive film layer 112. The metal material is formed from various metals including, but not limited to, copper (Cu) and aluminum (Al).

Figure 5:
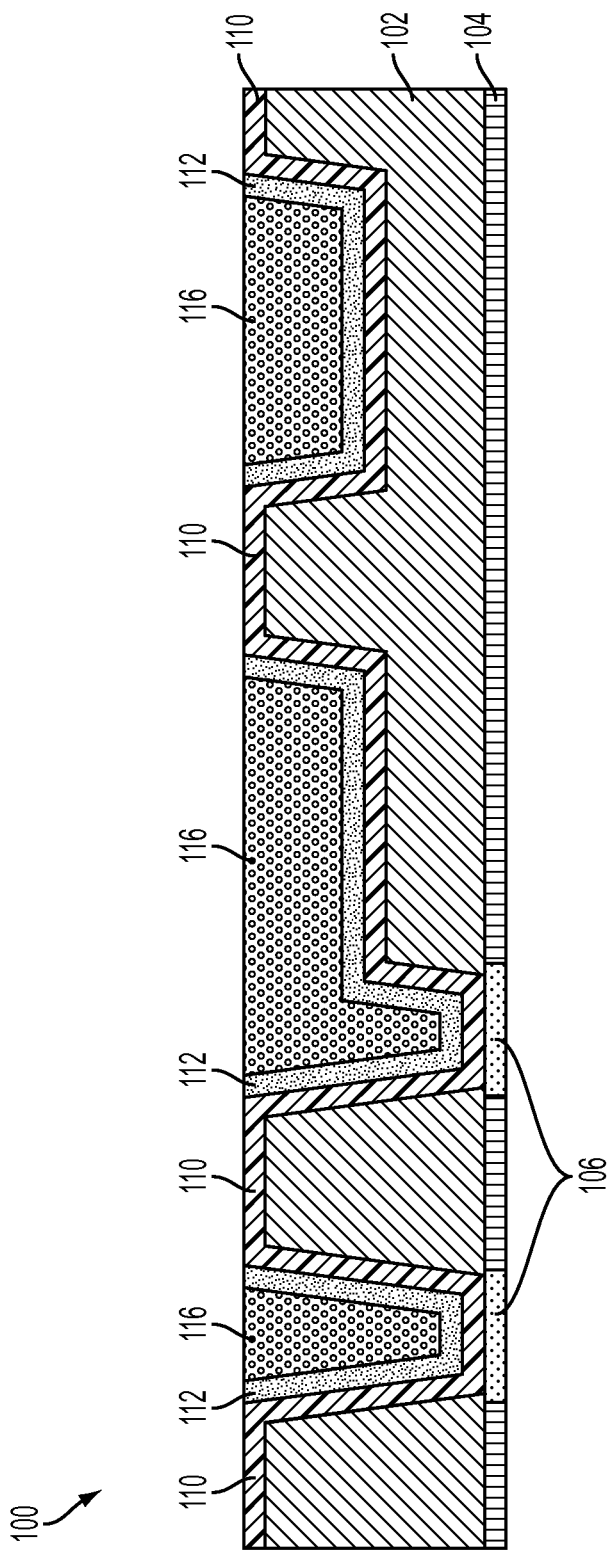

Turning now to FIG. 5, the metal material 114 is planarized according to a planarization process such as, for example, a chemical-mechanical planarization (CMP) process. The planarization process planarizes the metal material 114 such that a metallic portion such as, for example, one or more wiring regions 116, is formed in a respective cavity 108. Slurries associated with the planarization process are selective to the metal material 114 and the material (e.g., TaN) of the barrier layer 110. The planarization process, therefore, effectively preserves the barrier layer 110 while recessing only a negligible amount of the conductive film layer 112. As described above, the barrier layer 110 is configured as an etch stop layer. In this regard, the planarization process planarizes the metal material 114 and a portion of the conductive film layer 112, while stopping on the barrier layer 110. Accordingly, the upper surfaces of the wiring regions 116 and the conductive film layer 112 are each formed flush with the upper surface of the barrier layer 110. The wiring regions 116 have a thickness that is greater than the thickness of the barrier layer 110. For example, the thickness of the wiring regions 116 ranges from approximately 0.5 um to approximately 10 um.

Figure 6:
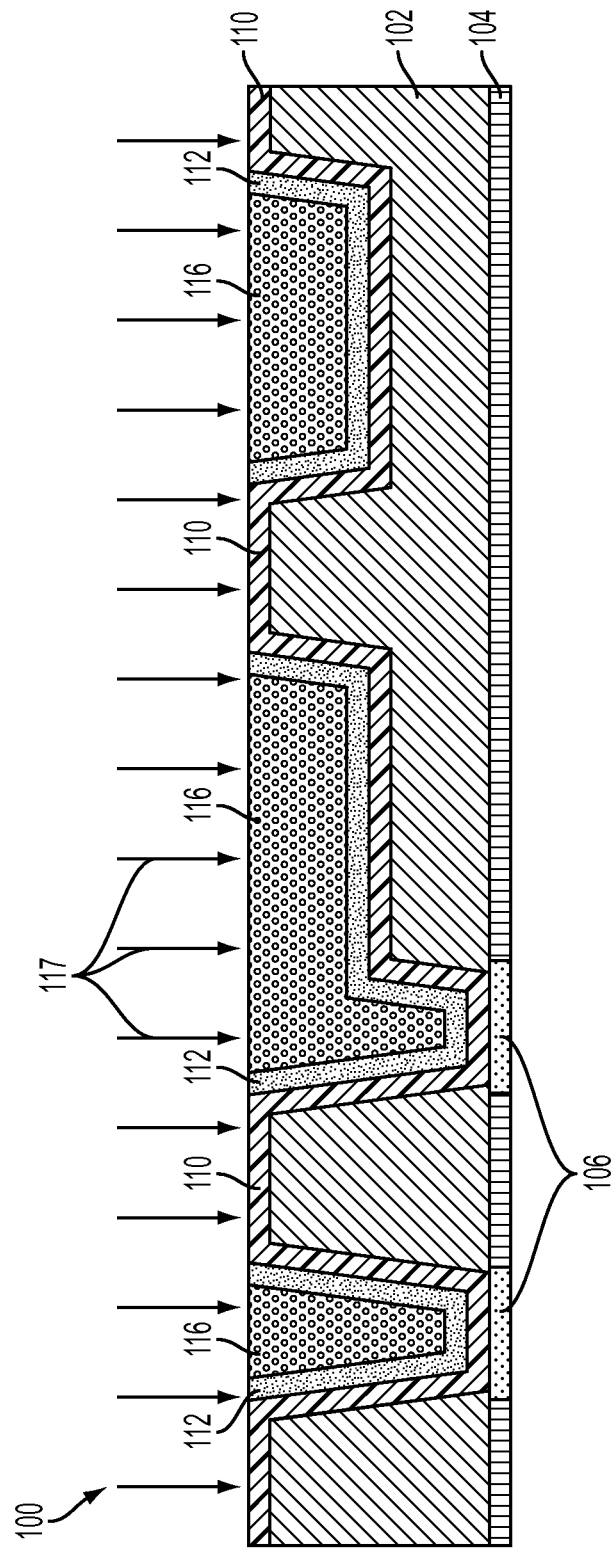

Referring to FIG. 6, a laser ablation process is performed, which directs energy pulses 117, e.g., ultra violet (UV) radiation pulses, to the substrate 100. The energy pulses 117 have fluences ranging from, for example, approximately 0.1 joules (J) per centimeter squared ($cm^2$) to approximately 2.0 $J/cm^2$. The energy pulses 117 have a wavelength ranging, for example, from approximately 126 nanometers (nm) to approximately 351 nm, and a pulse duration ranging, for example, from approximately 15 nanoseconds (ns) to approximately 35 ns. Various commercially available laser ablation tools may be used to generate the energy pulses 117. The energy pulses 117 are absorbed by the barrier layer 110 and the wiring regions 116. According to at least one embodiment, the laser beam can be controlled using an in-plane mask to reduce or prevent applying the energy pulses to critical structures such as C4s or delicate structures such as memory repair fuses formed on the substrate 100.

The energy pulses 117 generate excitation and/or radiate (e.g., heat) in the barrier layer 110. The higher thermal conductivity and material thickness of the wiring regions 116 causes the wiring regions 116 to absorb and dissipate the radiated energy, thereby preventing the ablation of the wiring layers. However, the thin barrier layer 110 quickly absorbs the radiated energy, and a combination of excitation and heat is generated due to the discontinuity of these two dissimilar materials. When the radiation excitation of the metal over the dielectric layer 102 exceeds a threshold, the barrier layer 110 is ablated and removed from the dielectric layer 102. According to an embodiment, the wiring regions 116 and the conductive film layer 112 are formed and are disposed on a common insulating material. In this case, the wiring regions 116 more rapidly dissipate the radiated energy when compared to the exposed dielectric layer 102 such that the underlying dielectric material heats to different temperatures, respectively. That is, the temperature of the dielectric material may be heated to different temperatures based on the thickness differential between the wiring regions 116 and the conductive film layer 112. According to at least one embodiment, the high energy pulse is applied while the substrate 100 is submerged under water. The use of water (or some other medium that is transparent to UV energy) allows for improved cooling after energy pulses are applied, while also eliminating the ejection of molten material back into the beam's path or onto the substrate 100.

Figure 7:
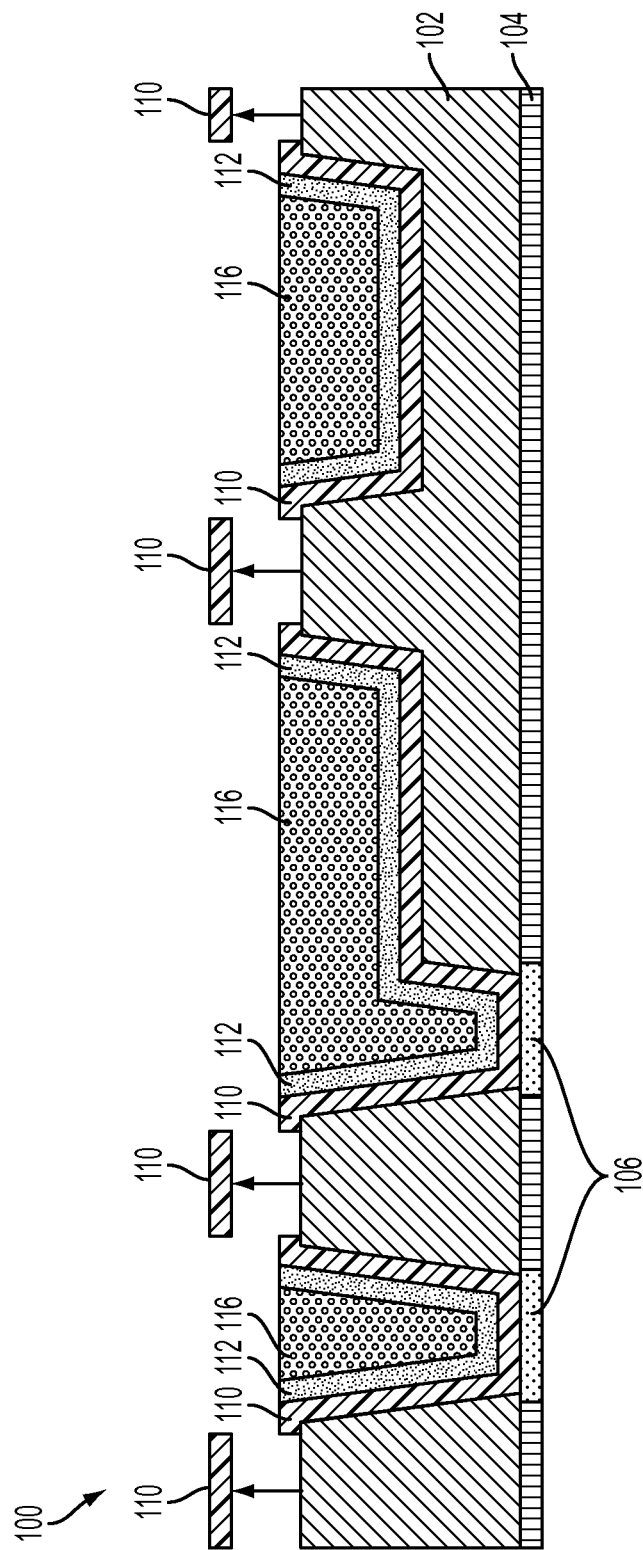

Turning now to FIG. 7, portions of the barrier layer 110 ablate from the dielectric layer 102 in response to heat and/or molecular excitation transferred between the material of the barrier layer 110 and the dielectric layer 102. However, the thickness differentials between the barrier layer 110 and the wiring regions 116 cause different portions of the dielectric material 102 to reach different temperatures. For example, a first portion of the dielectric layer 102 located below the barrier layer 110 and isolated from one or more wiring regions 116 is heated to a first temperature. However, a second portion of the dielectric layer 102 located proximate to a wiring region 116 is heated to a second temperature that is less than the first temperature. As a result, portions of the barrier layer 110 contacting portions of the dielectric material 102 that are heated to the temperature threshold are ablated, while other portions of the dielectric material 102 that do not reach the temperature threshold are maintained. According to at least one embodiment, portions of the barrier layer 110 that are isolated from the conductive film layer 112 formed on a respective wiring region 116, i.e., that do not directly contact the conductive film layer 112, are ablated while portions of the barrier layer 110 that are proximate to the conductive film layer 112, i.e., that contact or are very near to the conductive film layer 12 formed on a respective wiring region, are maintained.

The ablation process according to at least one exemplary embodiment of the disclosure contradicts conventional wisdom in that the traditional ablation processes requires a highly-conductive metal layer in order to absorb the energy and induce ablation of the metal layer. At least embodiment of the disclosure, however, achieves unexpected results in that the barrier layer 110 is selectively ablated (i.e., removed) with respect to the metal wiring regions 116 despite the barrier layer 110 (e.g., TaN or TiN) having an electrical conductivity that is substantially less than metal (e.g., Cu, Al, etc.) and having low thermal conductivity.

Figure 8:
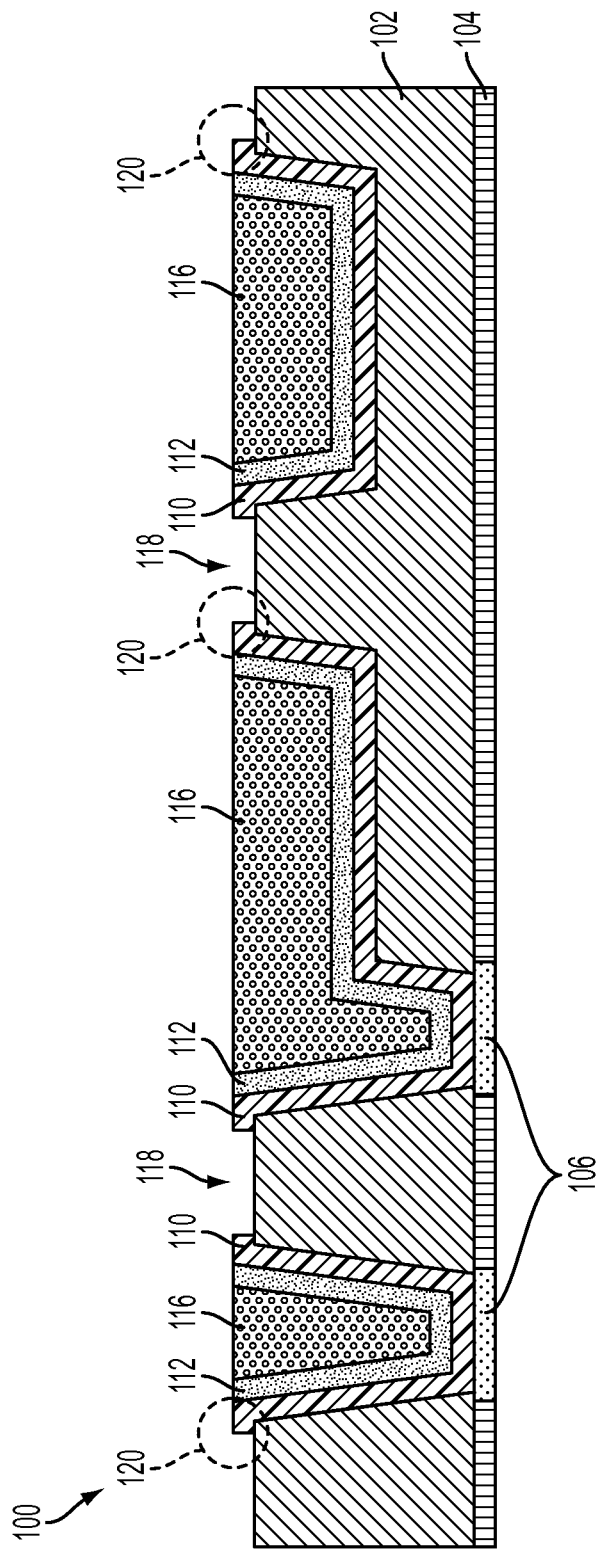

Referring to FIG. 8, the substrate 100 is shown following the laser ablation process. Portions of the barrier layer 110 located adjacent to the wiring regions 116 are removed from the dielectric layer 102, while the wiring regions 116 are preserved. The ablated regions of the barrier layer 110 form trenches 118 that expose the underlying dielectric layer 102. Accordingly, portions of the barrier layer 110 are selectively located at particular regions of the substrate 100 (e.g., between the dielectric layer 102 and the wiring regions 116), while targeted portions of the barrier layer 110 are selectively removed from the surface of the dielectric layer 102 without damaging the wiring regions 116 and/or the underlying dielectric layer 102. It is appreciated that debris collecting suction and/or subsequent washing process may be applied to the surface of the substrate 100 to reduce and/or remove debris formed during the laser ablation process. The surface of the substrate 100 can also be ashed to improve the surface properties of the exposed dielectric layer 102 as understood by one of ordinary skill in the art. Accordingly, a barrier layer 110 formed from TaN, for example, when exposed to laser radiation may be removed without aggressively attacking and damaging solder and/or wiring regions 116 formed on the substrate 100.

According to at least one embodiment, the barrier layer 110 may include one or more extension portions 120 that form an overcut which extends laterally from barrier layer 110 and over the dielectric layer 102 as further illustrated in FIG. 8. In this regard, a damascene structure is formed which includes wiring regions 116 that are not coplanar (i.e., not flush) with respect to the dielectric layer 102. Instead, the wiring regions 116 according to at least one embodiment illustrated in FIG. 8 extend beyond the dielectric layer 102 by a height equal to or greater than the thickness of the barrier layer 110. From this point, substrate fabrication processing as known in the art may continue.

Figure 9A:
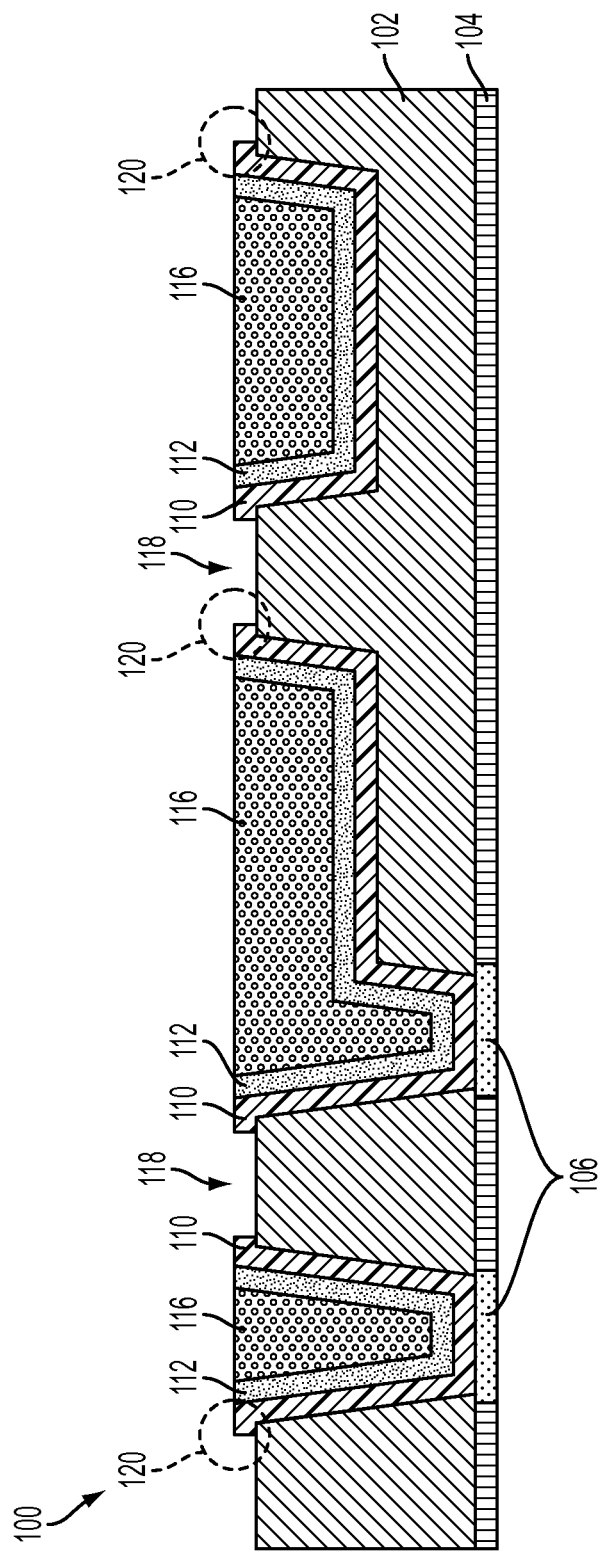
Figure 9B:
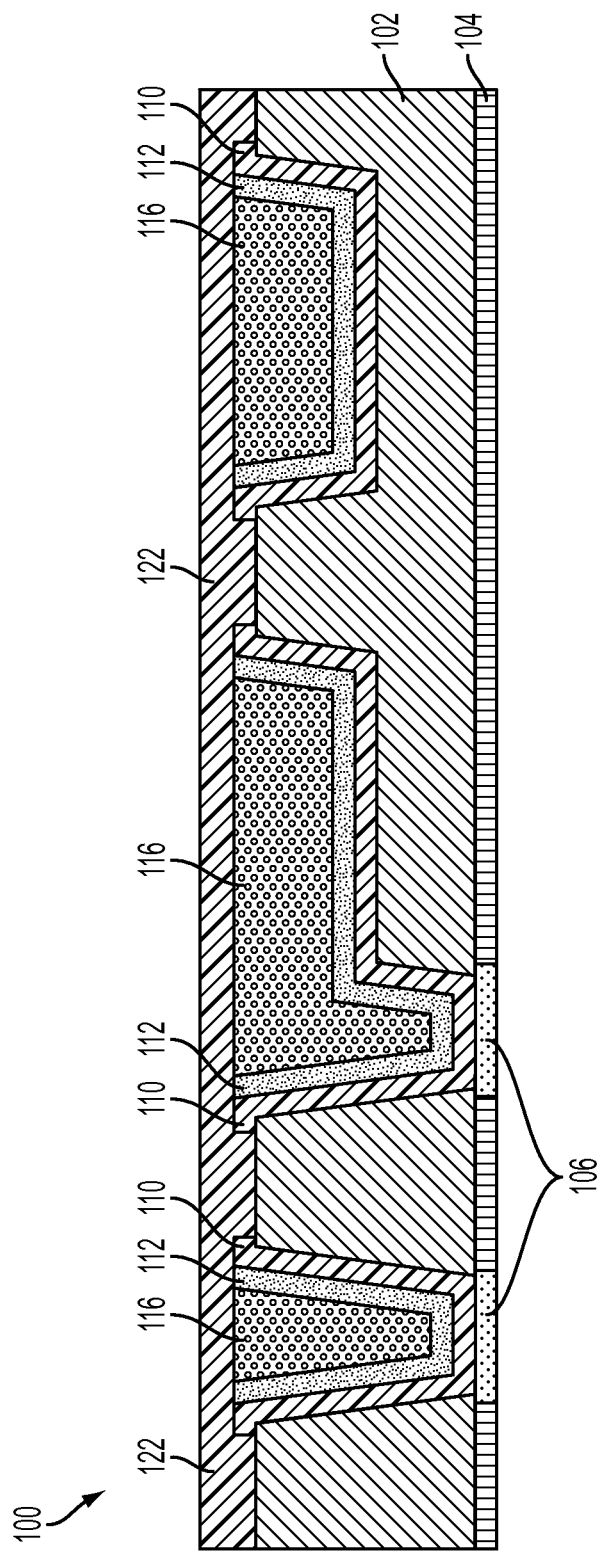
Figure 9D:
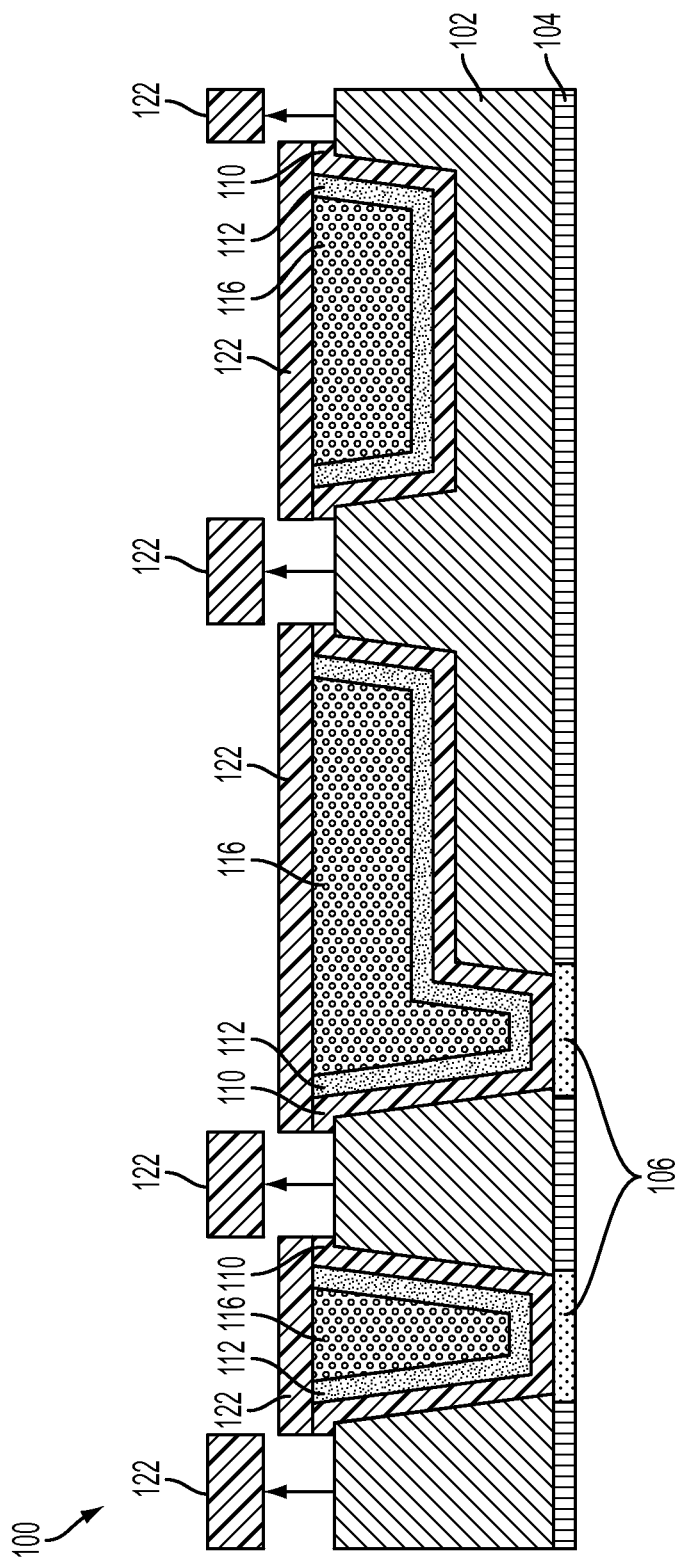
Figure 9E:
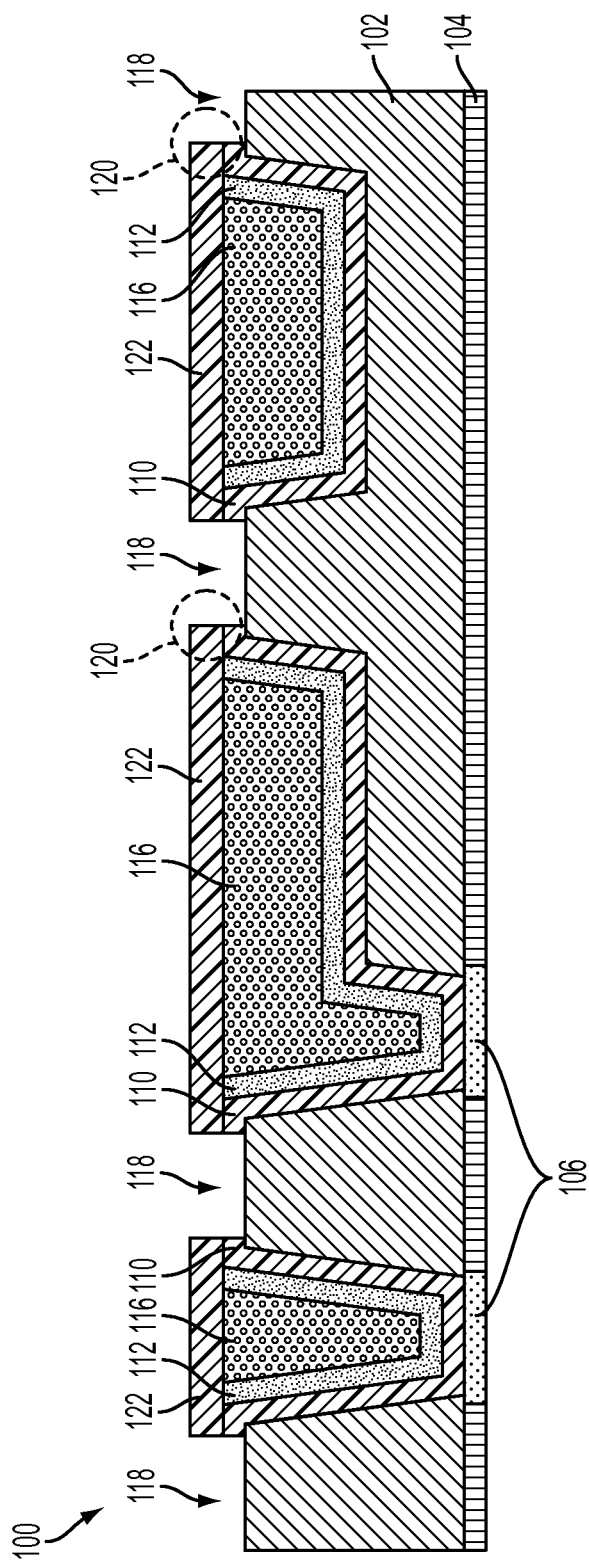

According to an embodiment, an encapsulating layer 122 may be formed on the upper surfaces of the barrier layer 110, the conductive film layer 112, the wiring regions 116, and the trenches 118 corresponding to the device illustrated in FIG. 9E. An exemplary process to fabricate such a device is illustrated in FIGS. 9A-9E.

The barrier layer 110 may be formed from a barrier material comprising a metal element and a non-metal element. The barrier layer 110 may also include a plurality of barrier layers to form a multi-layer barrier layer. The barrier layer 110 has a thickness ranging, for example, from approximately 500 angstroms (Å) to approximately 5000 Å.

The barrier layer 110 may also be formed from a barrier material (e.g., TaN) having an electrical conductivity that is substantially less than metal (e.g., Cu, Al, etc.). It is appreciated that the electrical conductivity may also be ascertained based on the electrical resistivity of the material as understood by one of ordinary skill in the art. The balance between the metal element (e.g. Ta) and the non-metal element (e.g. N) determines an electrical resistivity of the resulting barrier material. In this regard, a ratio of the metal element and the non-metal element may determine the electrical resistivity of the barrier material. According to an embodiment, the ratio of the electrical resistivity between the metal element and the non-metal element is, for example, 5(metal element): 1(non-metal element), which provides a forms a barrier layer 110 having an electrical resistivity ranging, for example, from approximately 200 micro-ohm*cm to approximately 400 micro-ohm*cm. Unlike pure metal (e.g., copper) that typically has an electrical resistivity of approximately 10 micro-ohm*cm or less, at least one non-limiting embodiment includes a barrier material layer 110 having an electrical resistivity of no less than no less than about 50 micro-ohm*cm. In an embodiment, for example, the metal element of the barrier layer 110 may have an electrical resistivity of approximately 200 micro-ohm*cm. The resistivity can be adjusted based on processing.

The metal material such as, for example, Cu, is encapsulated by the TaN encapsulating layer 122 as illustrated in FIG. 9B. Thereafter, a laser process may be re-applied to the substrate 100 such that the trenches 118 are re-opened as illustrated in FIGS. 9C-9D. The encapsulating layer 122 may be formed according to, for example, a sputtering process. Accordingly, the encapsulating layer 122 forms a barrier layer that encapsulates the wiring regions 116. In this regard, the encapsulating layer 122 provides increased adhesion to organic material that may be subsequently formed on the substrate 100.

Figure 10:
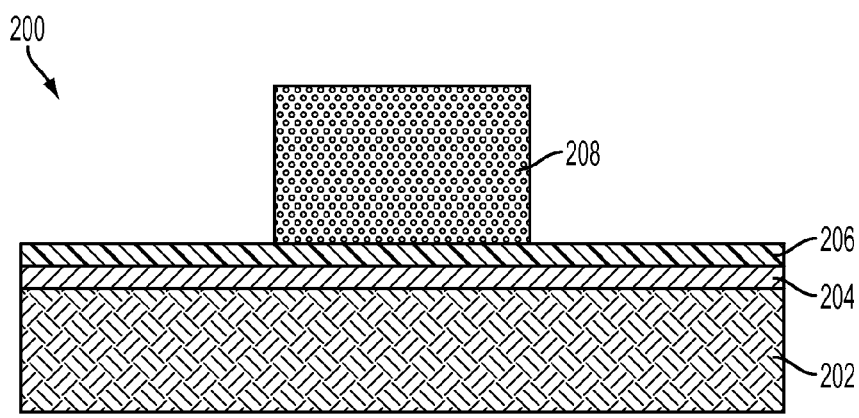

Turing now to FIGS. 10-14E, a series of diagrams illustrate a process flow for selectively locating a barrier layer on a substrate according to another embodiment. With reference to FIG. 10, a starting substrate 200 includes a dielectric layer 202, a barrier layer 204 formed on the dielectric layer 202, a conductive film layer 206 formed on the barrier layer 204, and a surface component 208 formed on the conductive film layer 206.

The dielectric layer 202 may be photo definable and comprises an organic material. Various polymer materials may be used to form the dielectric layer 202 including, but not limited to, polyimide (PI), polybenzobisoxazole (PBO), epoxy, bisbenzocyclobutene (BCB), and blends thereof.

The barrier layer 204 may be formed from a barrier material comprising a metal element and a non-metal element. The barrier layer 204 may also include a plurality of barrier layers to form a multi-layer barrier layer. The barrier layer 204 has a thickness ranging, for example, from approximately 500 angstroms (Å) to approximately 5000 Å.

The barrier layer 204 may also be formed from a barrier material having an electrical conductivity that is substantially less than metal (e.g., Cu, Al, etc.). It is appreciated that the electrical conductivity may also be ascertained based on the electrical resistivity of the material as understood by one of ordinary skill in the art. The balance between the metal element (e.g. Ta) and the non-metal element (e.g. N) determines an electrical resistivity of the resulting barrier material. In this regard, a ratio of the metal element and the non-metal element may determine the electrical resistivity of the barrier material. According to an embodiment, the ratio of the electrical resistivity between the metal element and the non-metal element is, for example, 5 (metal element):1(non-metal element), which provides a forms a barrier layer 204 having an electrical resistivity ranging, for example, from approximately 200 micro-ohm*cm to approximately 400 micro-ohm*cm. Unlike pure metal (e.g., copper) that typically has an electrical resistivity of approximately 10 micro-ohm*cm or less, at least one non-limiting embodiment includes a barrier material layer 204 having an electrical resistivity of no less than no less than about 50 micro-ohm*cm. In an embodiment, for example, the metal element of the barrier layer 204 may have an electrical resistivity of approximately 200 micro-ohm*cm. The electrical resistivity can be adjusted based on processing.

According to at least one embodiment, the barrier layer 204 may also include a plurality of barrier layers to form a multi-layer barrier layer, and is configured as an electromigration layer (i.e., seed layer) that allows a metal material such as, for example, a metal surface component 208, to be grown therefrom using, for example, an electroplating process as understood by one of ordinary skill in the art. The conductive film layer 206 formed on the upper surface of the barrier layer 204 using, for example, a sputtering process as understood by one of ordinary skill in the art. The conductive film layer 206 may be formed from, for example, Cu.

The surface component 208 includes, for example, a metal C4 element formed from Cu. Although not illustrated, it is appreciated that a variety of structures, such as interconnect structures, may exist below the surface component 208. The interconnect structures provide electrical connections between the surface component 208 and one or more embedded connection elements such as contact pads or terminals. According to other embodiments of the disclosure, the surface component 208 includes organic structures, polymeric structures, dielectric structures, and non-organic structures. The thickness of the surface component 208 is greater than the thickness of the barrier layer 204 and/or the conductive film layer 206. In the case of organic and/or polymeric dielectric materials, when exposed to an energy pulse these materials will partially etch or will remain unaffected when exposed to an energy pulse if the structure is capped by a sufficiently thick protective layer.

Figure 11A:
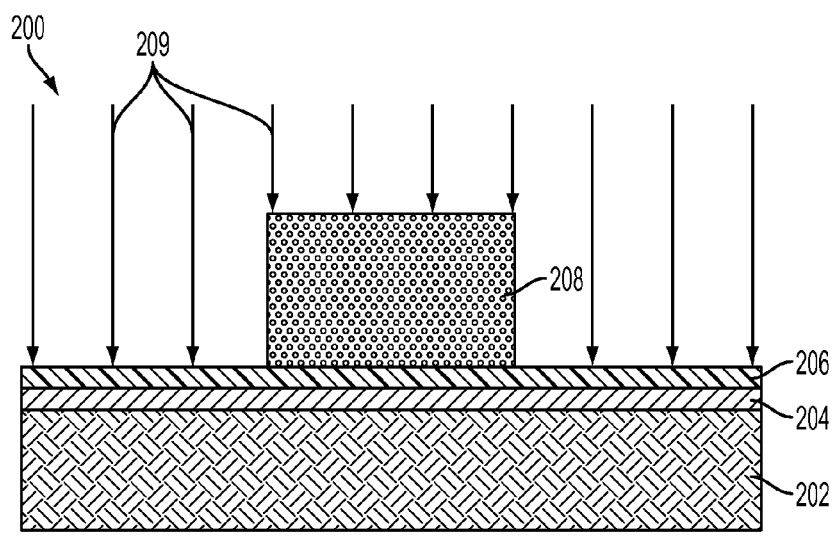
FIG. 11A illustrates the substrate of FIG. 10 undergoing a laser ablation process that directs energy pulses to the substrate according to a first embodiment.

Turning to FIG. 11A, a laser ablation process is performed, which directs energy pulses 209, e.g., ultra violet radiation (UV) pulses, to the substrate 200. The energy pulses 209 have fluences ranging from, for example, approximately 0.1 joules (J) per second centimeter ($cm^2$) to approximately 2.0 J/$cm^2$. The energy pulses 209 have a wavelength ranging, for example, from approximately 126 nanometers (nm) to approximately 351 (nm), and a pulse duration ranging, for example, from approximately 15 nanoseconds (ns) to approximately 35 ns. Various commercially available laser ablation tools may be used to generate the energy pulses 209.

The energy pulses 209 heat and/or excite the surface component 208, conductive film layer 206, and the barrier layer 204. The conductive film layer 206 and barrier layer 204 is selectively ablated from the dielectric layer 202 based on a localized excitation that occurs between the dielectric layer 202 and the conductive film 206 and barrier layer 204 stack. The larger mass of the surface component 208 allows for a larger amount of radiant energy dissipation, thereby shielding the underlying dielectric layer 202 from reaching a threshold process to induce ablation. A first portion of the dielectric layer 202 located proximate to and/or below a respective surface component 208 is heated to a first temperature. A second portion of the dielectric layer 202 located below a portion of the barrier layer 204 that is isolated from the surface component 208 is heated to a second temperature that is greater than the first temperature.

Figure 11B:
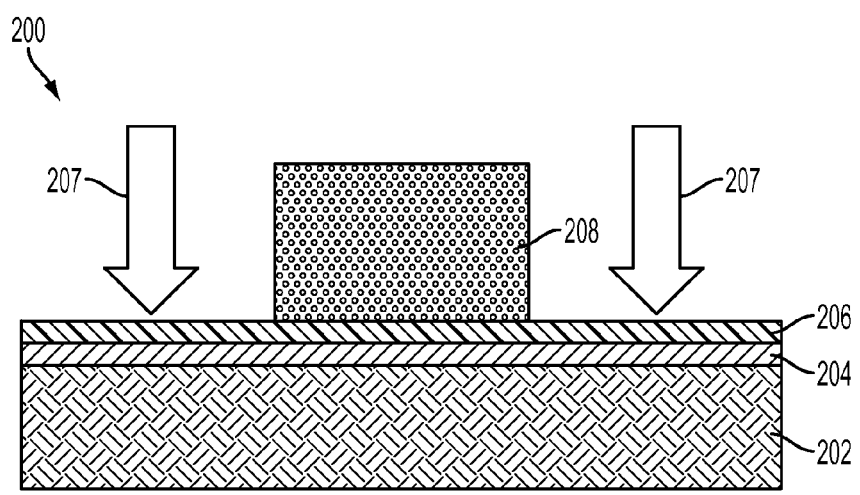
FIGS. 11B-11C illustrate the substrate of FIG. 10 undergoing a laser ablation process that directs energy pulses to the substrate according to a second embodiment.
Figure 11C:
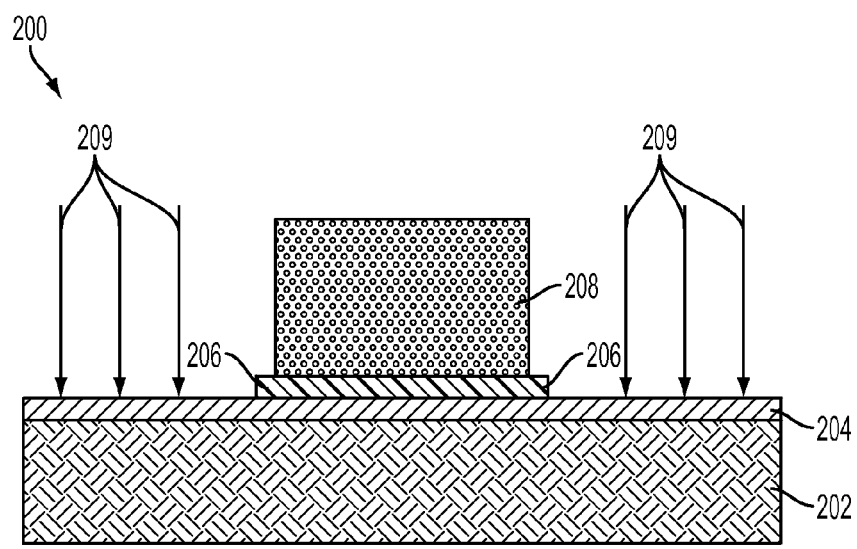

Although FIG. 11A illustrates applying the laser ablation process simultaneously to both the conductive film layer 206 and the barrier layer 204, another embodiment illustrated in FIGS. 11B-11C removes the conductive film layer 206 before performing the laser ablation process. More specifically, a first etching process 207, such as a wet etch process for example, is applied to the conductive film layer 206 as illustrated in FIG. 11B. The wet etching process 207 selectively removes the conductive film layer 206 while maintaining the underlying barrier layer 204. Following the wet etch process 207, the laser ablation process is applied to the remaining barrier layer 204 as illustrated in 11C. Accordingly, the level of energy required to remove the barrier layer 204 is reduced since the amount of material (i.e., the barrier layer 204) has a reduced thickness as compared to the thickness defined by the combination of the barrier layer 204 and the conductive film layer 206. According to at least one embodiment, the beam of energy pulses 209 can be controlled using an in-plane mask to reduce or prevent applying the energy pulses to structures such as C4s or delicate structures such as memory repair fuses formed on the substrate 200.

Figure 12:
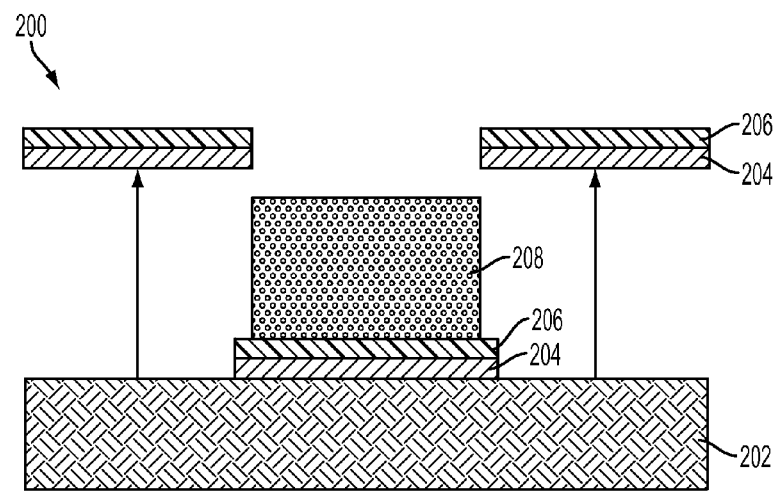

Turning now to FIG. 12, portions of the barrier layer 204 and the conductive film layer 206 ablate from the dielectric layer 202 in response to radiated energy and discontinuality between the barrier layer 204 and dielectric layer 202. The reaction occurs in response to the radiated energy and discontinuality between the barrier layer 204 and underlying dielectric layer 202. It is appreciated that if the conductive film layer 206 is formed on the barrier layer 204, the conductive film layer 206 is ablated along with the barrier layer 204. Although FIG. 12 illustrates portions of the barrier layer 204 and the conductive film layer 206 being ablated at locations extending between ends of the substrate 200 and the surface component 208, another embodiment allows for the barrier layer 204 and the conductive film layer 206 to ablate at a middle portion such that openings are formed as electrical viaducts. According to at least one embodiment, high energy pulses are applied while the substrate 200 is submerged under water. The use of water (or another medium that is transparent to UV energy) allows for improved cooling after energy pulses are applied, while also eliminating the ejection of debris and molten material back into the beam's path or onto the substrate 200.

The ablation result according to at least one exemplary embodiment of the disclosure illustrated in FIG. 12 contradicts conventional wisdom in that the traditional ablation processes requires a materials having high thermal conductivity (e.g., Cu) in order to absorb the energy and induce ablation of the metal layer. At least one embodiment of the disclosure, however, achieves unexpected results in that both the conductive film layer 206 and the barrier layer 204 are selectively ablated with respect to the surface component 208 despite the barrier layer 204 (e.g., TaN or TiN) having an electrical conductivity and a thermal conductivity that is substantially less than metal (e.g., Cu, Al, etc.). Accordingly, a barrier layer 204 formed from TaN, for example, may be removed without aggressively attacking and damaging solder and/or metal surface components 208 formed on the substrate 200.

Figure 13:
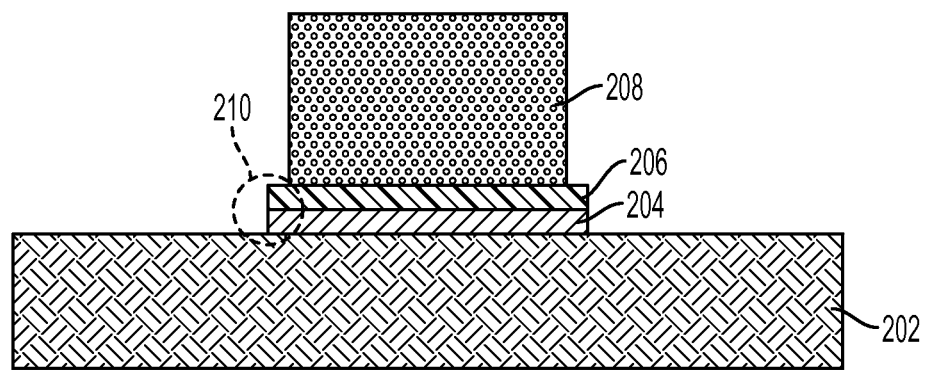

Referring to FIG. 13, the substrate 200 is shown following the laser ablation process. Portions of the barrier layer 204 located adjacent to the surface component 208 are removed from the dielectric layer 202, while the surface component 208 is preserved. Accordingly, portions of the barrier layer 204 are selectively located at particular regions of the substrate 200 (e.g., between the dielectric layer 202 and the surface component 208), while targeted portions of the barrier layer 204 are selectively removed from the surface of the dielectric layer 202 without damaging the surface component 208 and/or the underlying dielectric layer 202. It is appreciated that debris collecting suction and/or subsequent washing process is applied to the surface of the substrate 200 to reduce and/or remove debris formed during the laser ablation process. The surface of the substrate 200 can also be ashed and or wet cleaned to improve the surface properties of the exposed dielectric layer 202 as understood by one of ordinary skill in the art. From this point, substrate fabrication processing as known in the art may continue.

According to at least one embodiment, there is no undercutting between the surface component 208 and either the conductive film layer 206 or the barrier layer 204. As illustrated in FIG. 13, for example, the conductive film layer 206 and/or the barrier layer 204 may include an extension region 210 that extends laterally beyond the base of the surface component 208 such that no undercutting exists.

Figure 14A:
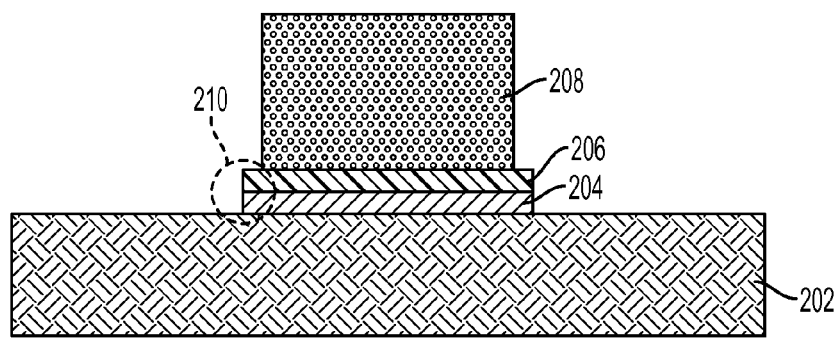
Figure 14B:
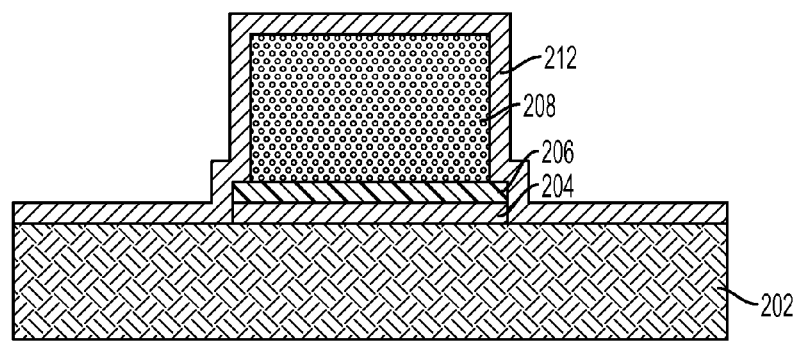
Figure 14C:
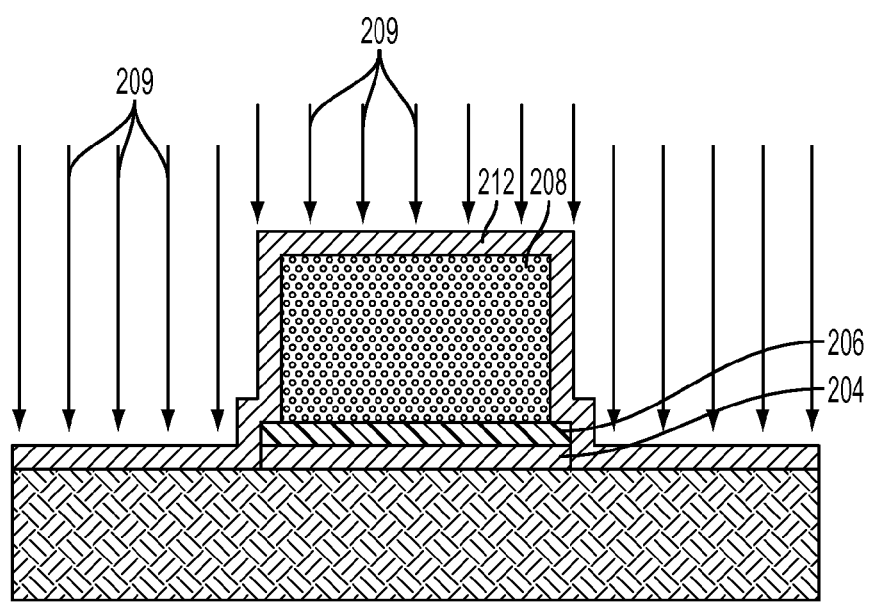
Figure 14D:
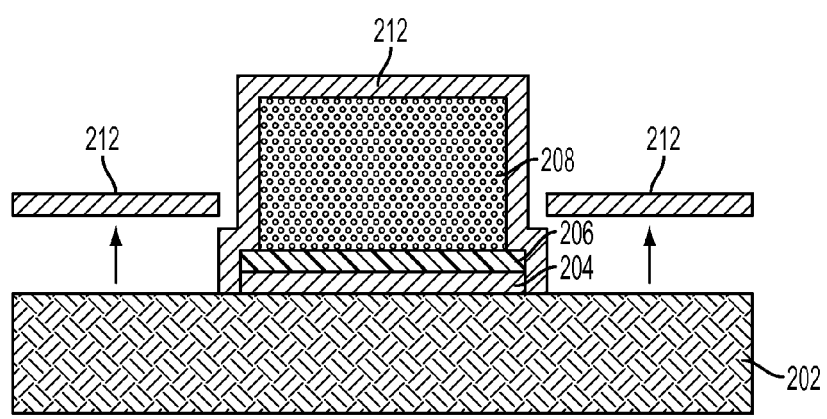
Figure 14E:
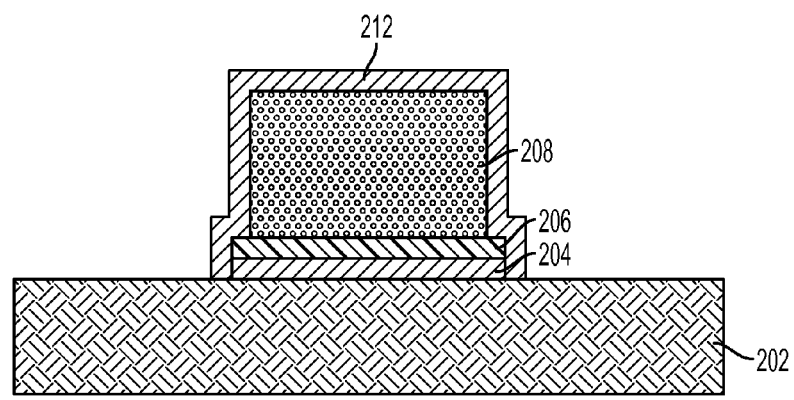

According to an embodiment, a non-metal encapsulating layer 212 may be formed on the upper surfaces of the dielectric layer 202, the extension regions 210 comprised of the barrier layer 204 and conductive film layer 206, and the surface component 208 corresponding to the device shown in FIG. 14A. The encapsulating layer 212 may be formed from, for example, TaN. In this regard, a surface component 208 formed from a metal material such as, for example, Cu, is encapsulated by the TaN encapsulating layer 212 as illustrated in FIG. 14B. Thereafter, a laser process may be re-applied to the substrate 200 such that the dielectric layer 202 is re-opened as illustrated in FIGS. 14C-14D. The encapsulating layer 212 may be formed according to, for example, a sputtering process. Accordingly, the encapsulating layer 212 forms a barrier layer that encapsulates the surface component 208 as illustrated in FIG. 14E. The encapsulating layer 212 has increased adhesion to organic material that may be subsequently formed on the substrate 200.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of selectively locating a barrier layer on a substrate, the method comprising:
    forming a barrier layer on a surface of the substrate, the barrier layer comprising a metal element and a non-metal element;
    forming an electrically conductive film layer on the barrier layer;
    forming a metallic portion in the electrically conductive film layer;
    selectively ablating portions of the barrier layer from a dielectric layer after forming the metallic portion so as to form trenches that expose portions of the dielectric layer having a first height that is less than a second height of the metallic portion; forming an encapsulation layer in the exposed portions of the dielectric layer and selectively radiating the encapsulation layer based on a first thickness of the metallic portion and a second thickness of the barrier layer.

2. The method of claim 1, wherein the barrier layer has an electrical resistivity no less than about 50 micro-ohm*cm.

3. The method of claim 2, wherein the barrier layer is formed from a material selected from the group comprising tantalum nitride (TaN) and titanium nitride (TiN), and the substrate is formed from a dielectric material.

4. The method of claim 3, wherein the selectively ablating portions of the barrier layer includes directing energy pulses to the barrier layer such that the barrier layer ablates from the dielectric layer in response to laser radiation and discontinuity of the underlying dielectric layer.

5. The method of claim 4, wherein the selectively ablating portions of the barrier layer includes selectively radiating a first portion of the dielectric layer to a first temperature while radiating a second portion of the dielectric layer to a second temperature less than the first temperature.

6. The method of claim 5, wherein the first portion of the dielectric layer is below the barrier layer and is isolated from the metallic portion, and a second portion of the dielectric layer is below the metallic portion.

7. The method of claim 1, wherein the second thickness of the barrier layer is less than the first thickness of the metallic portion such that laser radiation is transferred via the barrier layer to dielectric layer and creates a disassociation to the dielectric layer while the metallic portion inhibits the second portion of the dielectric layer from reaching an ablation threshold.

8. The method of claim 7, wherein the forming a metallic portion on the electrically conductive film layer further comprises:

defining at least one cavity using the conductive film layer;

filling the at least one cavity with a metal material; and planarizing the metal material and the conductive film layer until reaching the barrier layer to form a metallic wiring region that is flush with the barrier layer.

9. The method of claim 8, wherein the selectively ablating portions of the barrier layer includes ablating portions of the barrier layer that are isolated from the conductive film layer to re-expose a portion of the dielectric layer.

10. The method of claim 9, further comprising:

forming the encapsulation layer on the metallic wiring region and the re-exposed portions of the dielectric layer, the encapsulation layer formed from TaN; and directing energy pulses to the encapsulation layer such that a first portion of the encapsulation layer ablates from the re-exposed portions of the dielectric layer while a second portion of the encapsulation layer is maintained and encapsulates the metallic wiring region.

* * * * *